(12) United States Patent
Song et al.

(10) Patent No.: US 11,765,528 B2
(45) Date of Patent: Sep. 19, 2023

(54) SENSING DEVICE AND METHOD FOR PACKAGING THE SAME

(71) Applicant: LITE-ON SINGAPORE PTE. LTD., Singapore (SG)

(72) Inventors: Guang-Li Song, Singapore (SG); Suresh Basoor Nijaguna, Singapore (SG); Qian Pang, Jiamusi (CN)

(73) Assignee: LITE-ON SINGAPORE PTE. LTD., Singapore (SG)

( * ) Notice: Subject to any disclaimer, the term of this patent is extended or adjusted under 35 U.S.C. 154(b) by 195 days.

(21) Appl. No.: 17/034,238

(22) Filed: Sep. 28, 2020

(65) Prior Publication Data
US 2022/0103954 A1    Mar. 31, 2022

(51) Int. Cl.
| B81B 7/00 | (2006.01) |
| H04R 31/00 | (2006.01) |
| H04R 25/00 | (2006.01) |
| B81C 1/00 | (2006.01) |

(52) U.S. Cl.
CPC ......... *H04R 25/603* (2019.05); *B81C 1/0023* (2013.01); *H04R 31/006* (2013.01); *B81B 7/0032* (2013.01); *B81B 2201/0257* (2013.01); *H04R 2231/003* (2013.01)

(58) Field of Classification Search
CPC ........................... B81B 7/0032; H01L 23/495
See application file for complete search history.

(56) References Cited

U.S. PATENT DOCUMENTS

| 2009/0046183 A1* | 2/2009 | Nishida | H01L 21/6835 438/66 |
| 2014/0374776 A1* | 12/2014 | Nakasuji | H01L 25/167 257/82 |
| 2015/0160087 A1* | 6/2015 | Foong | H01L 24/09 73/146.2 |
| 2016/0343644 A1* | 11/2016 | Kawashima | H01L 23/4334 |

* cited by examiner

*Primary Examiner* — Moazzam Hossain
(74) *Attorney, Agent, or Firm* — Li & Cai Intellectual Property (USA) Office

(57) ABSTRACT

A sensing device and a method for packaging the same are provided. The sensing device includes a lead frame, a chip, an insulated housing, a sensor, and a protector. The lead frame includes a first surface, a second surface opposite to the first surface, a first die-bonding area and a plurality of wire bonding areas of the lead frame disposed on the first surface, and a second die-bonding area disposed on the second surface. The chip is disposed in the first die-bonding area and is electrically connected to the plurality of wire bonding areas of the lead frame. The insulated housing covers the chip and a portion of the lead frame. The sensor is disposed on the second die-bonding area of the lead frame, and the protector is disposed on the sensor.

15 Claims, 6 Drawing Sheets

SENSING DEVICE AND METHOD FOR PACKAGING THE SAME

FIELD OF THE DISCLOSURE

The present disclosure relates to a sensing device and a method for the same, and more particularly to a sensing device for miniaturized devices and a method for packaging the same.

BACKGROUND OF THE DISCLOSURE

With the advancement of technology, smart hearing aid devices are becoming more common. Moreover, the functionality of the smart hearing aid devices increases day by day, which are not only used for hearing, but also capable of having more functions and longer usage time. For example, infrared temperature sensing elements can be further installed into the smart hearing aid devices to sense the body temperature and detect the health condition of a user, or control the hearing aid devices to turn on and off, as well as provide noise control or monitoring of sleep quality.

While hearing aid devices or smart devices are becoming smaller in size, multiple components need to be installed into the hearing aid devices or miniaturized devices, and the size of the sensing elements is too large. Therefore, how the design of a package structure can be improved to reduce the volume of the sensing elements and to further reduce the manufacturing cost has become one of the important issues in the art.

SUMMARY OF THE DISCLOSURE

In response to the above-referenced technical inadequacies, the present disclosure provides a sensing device and a method for packaging the same so as to reduce the volume of the sensing devices and solve the issue of a volume of sensing devices used in hearing aid devices being too large.

In one aspect, the present disclosure provides a sensing device that includes a lead frame, a chip, an insulated housing, a sensor, and a protector. The lead frame includes a first surface, a second surface opposite to the first surface, a first die-bonding area and a plurality of wire bonding areas of the lead frame disposed on the first surface, and a second die-bonding area disposed on the second surface. The chip is disposed in the first die-bonding area of the lead frame and is electrically connected to the wire bonding areas of the lead frame.

The insulated housing covers the chip and a portion of the lead frame. The sensor is disposed on the second die-bonding area of the lead frame, and the protector is disposed on the sensor.

One of the beneficial effects of the present disclosure is that, the volume of the sensing device of the present disclosure can be reduced by virtue of "disposing the chip and the sensor on the first surface and the second surface that are opposite to each other, respectively."

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
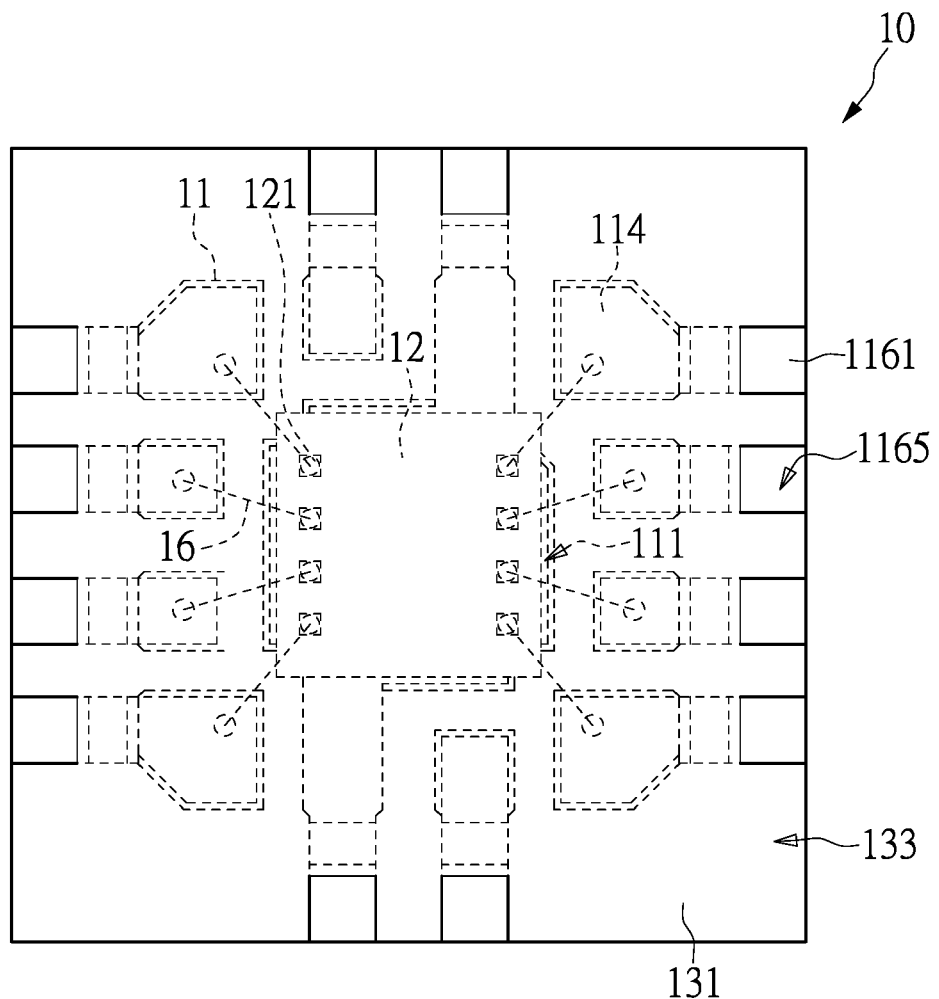
FIG. 1 is a bottom view of a sensing device according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 5, an embodiment of the present disclosure provides a sensing device 10 that includes a lead frame 11, a chip 12, an insulated housing 13, a sensor 14, and a protector 15.

Figure 4:
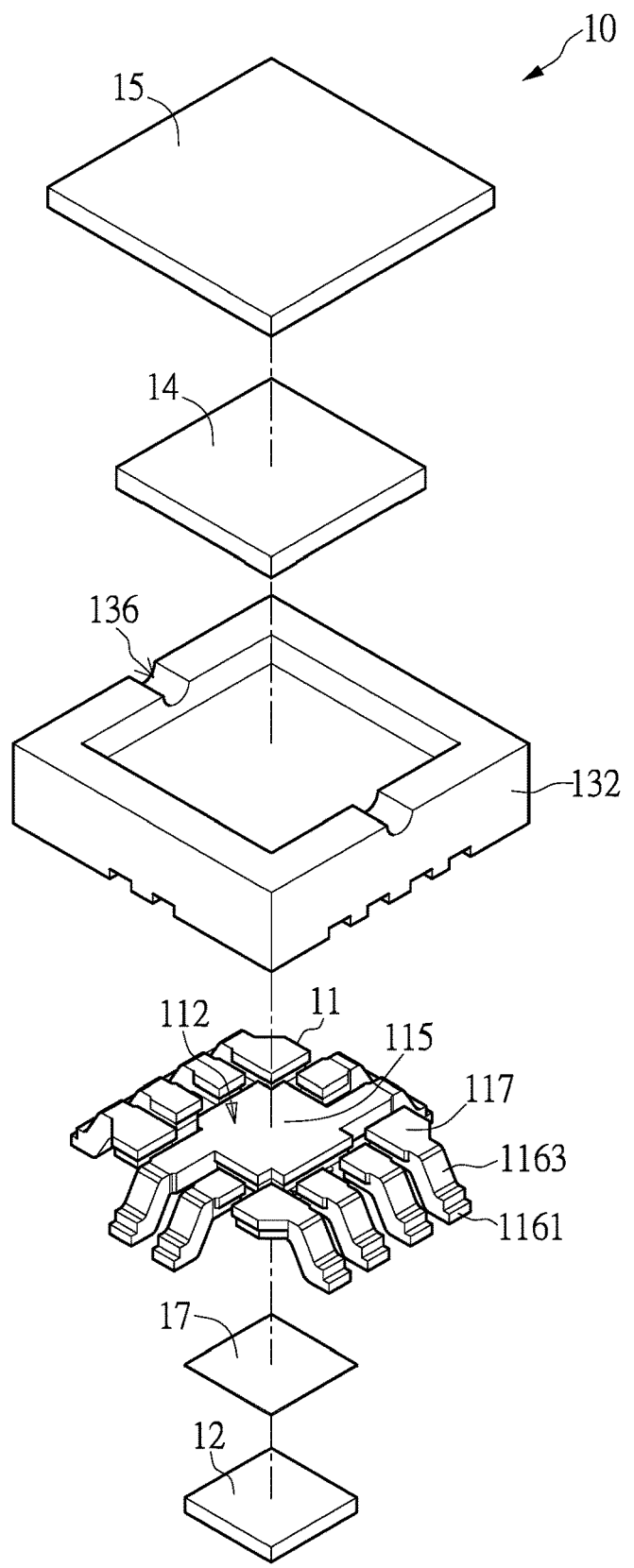
FIG. 4 is an exploded view of the sensing device according to one embodiment of the present disclosure.
Figure 5:
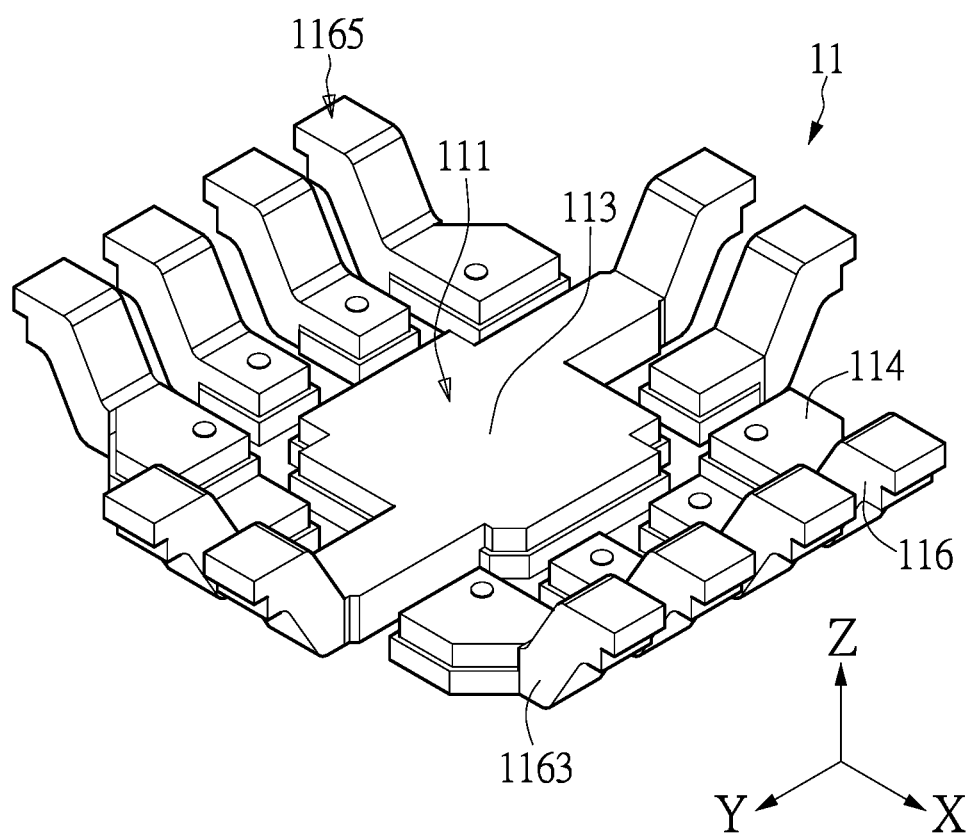
FIG. 5 is a schematic view of a lead frame according to the present disclosure.

Referring to FIG. 4 and FIG. 5, the lead frame 11 includes a first surface 111 and a second surface 112, the second surface 112 is opposite to the first surface 111, a first die-bonding area 113 of the lead frame 11 and a plurality of wire bonding areas 114 of the lead frame 11 are disposed on the first surface 111 of the lead frame 11, and a second die-bonding area 115 and a plurality of pad areas 117 are disposed on the second surface 112 of the lead frame 11. The first die-bonding area 113 corresponds to the second die-bonding area 115, and the wire bonding areas 114 correspond to the pad areas 117. The wire bonding areas 114 are disposed around the first die-bonding area 113. In addition, as shown in FIG. 5, the wire bonding areas 114 respectively extend outward in a first direction (−X axis direction or +X axis direction) or a second direction (−Y axis direction or +Y axis direction) to form a plurality of pins 116. When the lead frame 11 is being installed in an electronic device (not shown), the sensing device 10 can electrically connect to other electronic components (not shown) through the pins 116. Also, a quantity of the pins 116 may vary according to different types of chips 12.

Figure 3A:
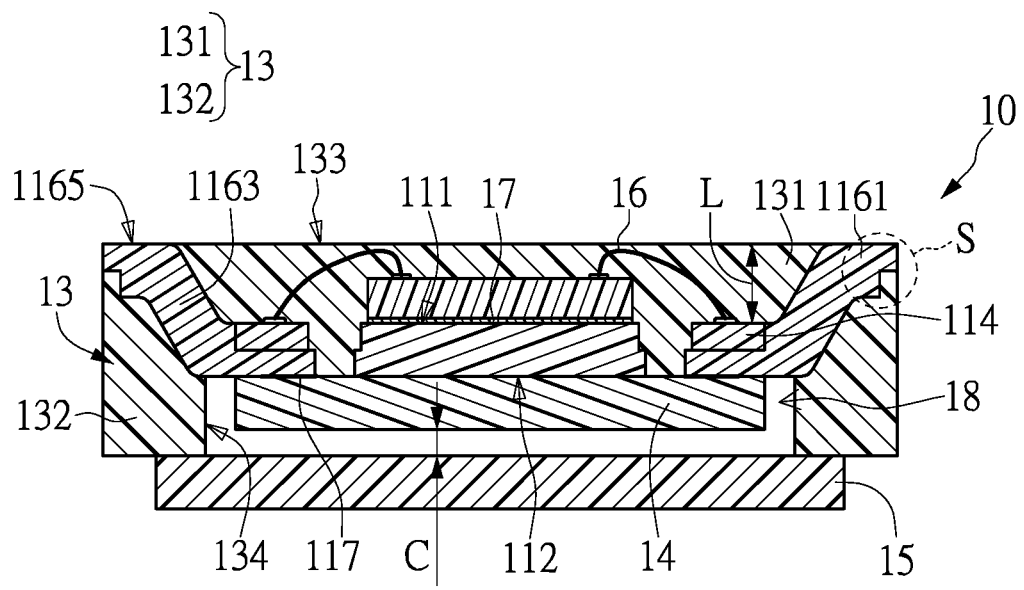
FIG. 3A is a cross-sectional view of the sensing device according to the embodiment of the present disclosure.

Furthermore, a shape of the pins 116 can also be different. In a preferred embodiment of the present disclosure, as shown in FIG. 4 or FIG. 5, the pins 116 are bent outward and extend along a direction towards a bottom surface from the wire bonding areas 114 of the first surface 111. More specifically, the wire bonding areas 114 respectively extend outward and bend at a predetermined angle in the first direction or the second direction (X-axis direction or Y-axis direction) to form a plurality of structures that correspondingly surround the first die-bonding area 113. The pins 116 include an external part 1161 and a bending part 1163, one end of the pins 116 forms a plurality of contact surfaces 1165 parallel to a surface of the wire bonding areas 114, and a step difference L is formed between the surface of the wire bonding areas 114 and a contact surface 1165 of the pins 116, as shown in FIG. 3A. The drawings of the present disclosure are for exemplary purposes only, and do not limit an appearance of the lead frame 11 of the present disclosure to what is presented in the drawings. In different embodiments, the shape of the pins 116 can be different.

In the present disclosure, the chip 12 is preferably an integrated circuit chip for special applications. The chip 12 is disposed in the first die-bonding area 113 of the first surface 111 of the lead frame 11, and is electrically connected to the wire bonding areas 114 of the first surface 111 of the lead frame 11 through a plurality of conductive wires 16 by wire bonding. Since the pins 116 form a structure surrounding the first die-bonding area 113, the chip 12 and the conductive wires 16 can be protected from damages caused by external forces. Furthermore, a height of the step L between the surface of the wire bonding areas 114 and the contact surface 1165 of the pins 116 is determined by an overall package height required by the chip 12. The overall package height required by the chip 12 is determined by a sum of a height of the chip 12 and a wire bonding height required for the subsequent conductive wires 16.

As shown in FIG. 3A, on the first surface 111 of the lead frame 11, the step L of the pins 116 is higher than a vertical height of the conductive wires 16. Therefore, a sealant material can be covered to be flush with the contact surface 1165 of the pins 116 of the lead frame 11 in the subsequent sealing process, so that a portion of the insulated housing 13 can completely cover the chip 12 and the conductive wires 16 for protection thereof. In addition, a heat dissipation film 17 can be further disposed between the lead frame 11 and the chip 12, so that heat generated by the chip 12 during operation can be quickly transferred to the lead frame 11 through the heat dissipation film 17 to achieve a good heat dissipation effect. However, a heat dissipation paste can be applied between the lead frame 11 and the chip 12 to also achieve the purpose of heat dissipation of the chip 12. Alternatively, in another embodiment of the present disclosure, neither a thin film nor a heat dissipation material is disposed or applied between the lead frame 11 and the chip 12, and it is not limited herein.

Figure 3B:
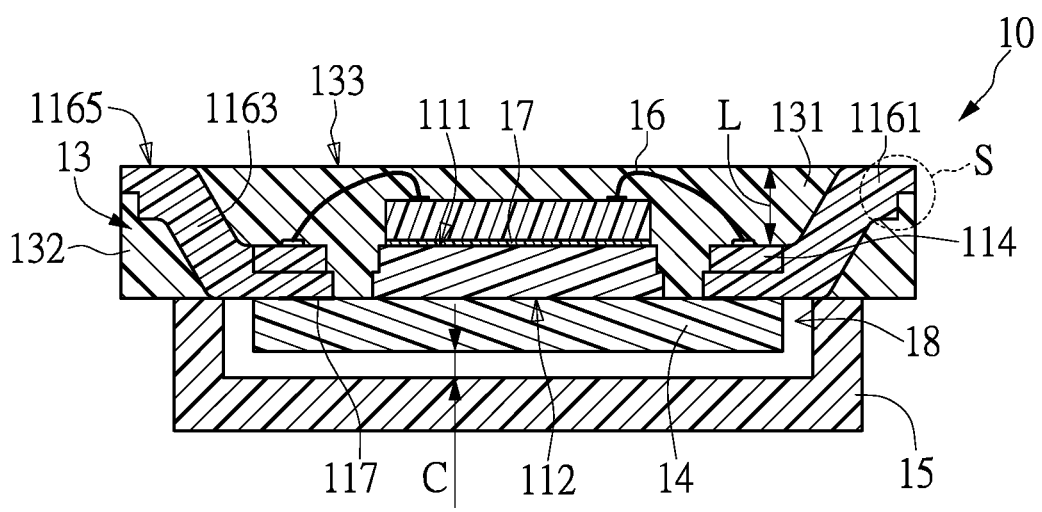
FIG. 3B is a cross-sectional view of a sensing device according to another embodiment of the present disclosure.

In the embodiment of the present disclosure, the insulated housing 13 covers the chip 12 and a portion of the lead frame 11. The insulated housing 13 can be divided into a first part 131 and a second part 132, the first part 131 is located on the first surface 111 of the lead frame 11, and the second part 132 is located on the second surface 112 of the lead frame 11. Specifically speaking, the first part 131 is located between the pins 116 and covers the chip 12 and the conductive wires 16, and a top surface 133 of the first part 131 is flush with the contact surface 1165 of the pins 116 to protect the chip 12 and the conductive wires 16. The first part 131 is filled in a gap between the first die-bonding area 113 and the wire bonding areas 114, and is flush with the second surface 112 of the lead frame 11, such that a die bonded flat surface for the subsequent sensor 14 is provided, and the first die-bonding area 113 is electrically separated from the wire bonding areas 114. The second part 132 is disposed around the pins 116 of the lead frame 11 and is located on the second surface 112, so as to protect the pins 116 and be connected to the protector 15. As shown in FIGS. 3A and 3B, the insulated housing 13 completely cover the bending part 1163 of the lead frame 11 via the first part 131 and the second part 132, so as to strengthen the structure. The pins 116 are preferably of a stepped structure S in a region in proximity to the second part 132 of the insulated housing 13. That is to say, a thickness of the pins 116 exposed on a side surface of the insulated housing 13 is less than a thickness of the wire bonding areas 114, preferably not more than half of the thickness of the wire bonding areas 114. Moreover, a side surface of the pins 116 can be exposed from the insulated housing 13 or flush with the surface of the insulated housing 13, and it is not limited herein. The pins 116 with the stepped structure S not only improves a bonding between the lead frame 11 and the insulated housing 13, but also helps the pins 116 to reduce a cutting stress of a single sensing device 10, and prevents burrs from being produced in the cutting process.

Figure 2:
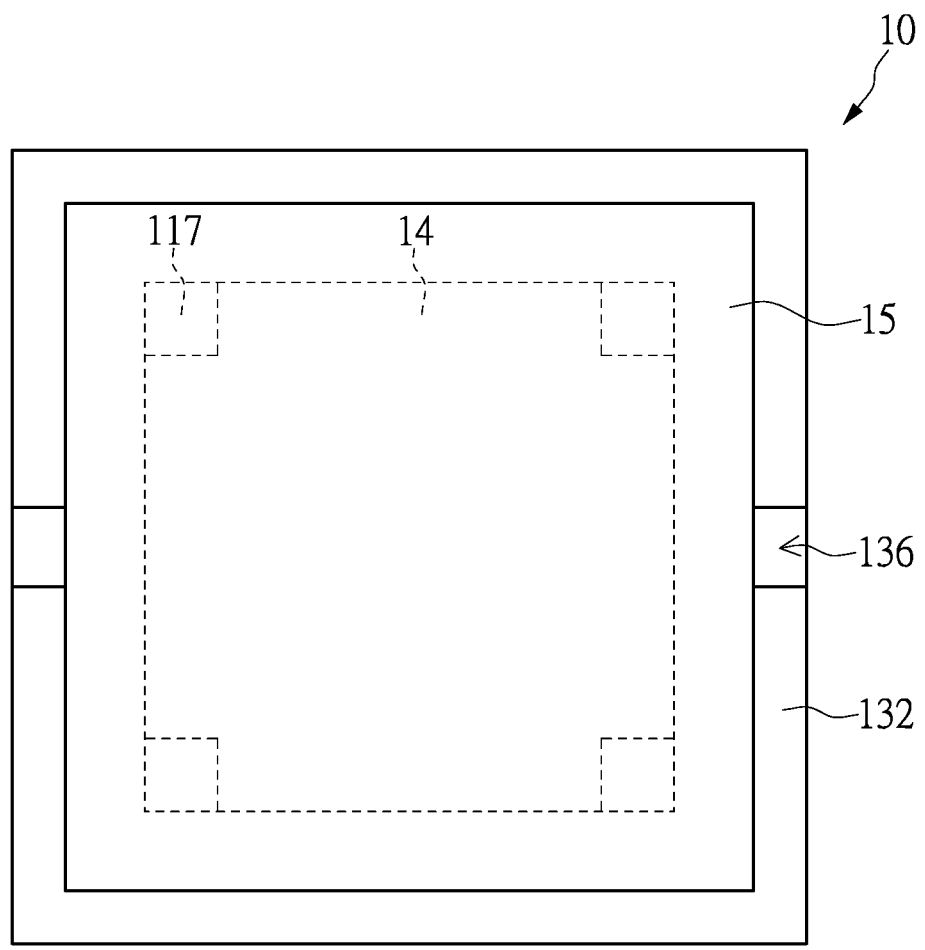
FIG. 2 is a top view of the sensing device according to one embodiment of the present disclosure.

Referring to FIG. 3A, the second part 132 has a housing wall 134. The housing wall 134 surrounds a periphery of the second die-bonding area 115 of the lead frame 11 to form an accommodating groove 18, so that the sensor 14 can be subsequently placed and be exposed in the accommodating groove 18. Additionally, at least one notch 136 can be formed on a surface of the second part 132 of the insulated housing 13, so that users can separate the protector 15 from the insulated housing 13 through the at least one notch 136, and corresponding two notches 136 are formed on top surfaces of two corresponding sides of the second part 132 of the insulated housing 13, as shown in FIG. 2 and FIG. 4. A material of the insulated housing 13 can be silicone or epoxy resin, and a color of the material of the insulated housing 13 is preferably black, so as to prevent ambient light from interfering with the sensing ability of the sensor 14. However, the insulated housing 13 can be of other colors. Any color that can block ambient light and transmit only infrared light can be the color of the sealant material of the present disclosure, but it is not limited herein.

Further referring to FIG. 3A, the sensor 14 is disposed on the second die-bonding area 115 of the second surface 112. That is, the sensor 14 is placed in the accommodating groove 18 formed by the second part 132 of the insulated housing 13. The sensor 14 in the present disclosure is preferably an infrared sensor. A bottom portion of the sensor 14 is in direct contact with the second die-bonding area 115 of the second surface 112 of the lead frame 11, and is electrically connected to the pins 116 of the lead frame 11. The sensor 14 also directly contacts the pad areas 117 surrounding the second die-bonding area 115, so that heat generated by the sensor 14 during operation can be quickly transferred to the second die-bonding area 115 of the lead frame 11 and the pad areas 117, and a temperature of the sensor 14 can thus be maintained as much as possible the same as a temperature of the external environment.

Further, the protector 15 is disposed on the sensor 14. Referring to FIG. 4, the protector 15 is disposed on the sensor 14 and does not directly contact the sensor 14. The protector 15 is supported by the second part 132 of the insulated housing 13 located around the pins 116. A gap C can be formed between the protector 15 and the sensor 14 to ensure that the protector 15 and the sensor 14 will not collide with each other. The protector 15 can be made of a light-transmitting material, preferably glass or resin that only allows infrared light to penetrate through, but it is not limited herein. In the present disclosure, the chip 12 and the sensor 14 are disposed on the first surface 111 and the second surface 112 of the lead frame 11 that are different from each other, respectively; when compared with the conventional arrangement of having the chip 12 and the sensor 14 disposed on the same plane, such a configuration achieves the purpose of reducing the sensing device 10. A larger area is required when both the chip 12 and the sensor 14 are placed on the same plane, thereby increasing an overall size. Therefore, the chip 12 and the sensor 14 are placed on different planes to achieve the purpose of reducing the area required in practical use and the overall size.

Referring to FIG. 3B, in a second embodiment, the protector 15 can be in a U-shaped structure, and the surface of the second part 132 is flush with the surface of the second die-bonding area 115. Left and right ends of the protector 15 protrude and abut against a surface of the first part 131 of the insulated housing 13. In the second embodiment of FIG. 3B, the insulated housing 13 also includes the first part 131 and the second part 132, and a location of the first part 131 and the second part 132 are similar to that of the first embodiment, and will not be repeated herein. The difference is that the surface of the second part 132 is flush with the pad areas 117. More specifically, a bottom portion of the first part 131, the surface of the second part 132, and the surface of the second die-bonding area 115 are coplanar with a surface of the pad areas 117. The protector 15 is in the U-shaped structure, which can also form the accommodating groove 18 between the left and right ends of the protector 15, so that the sensor 14 can be subsequently placed in the accommodating groove 18. Since other elements of the sensing device 10 of the second embodiment are the same as those of the sensing device 10 of the first embodiment, the description of the other elements of the second embodiment will be omitted herein.

Figure 6:
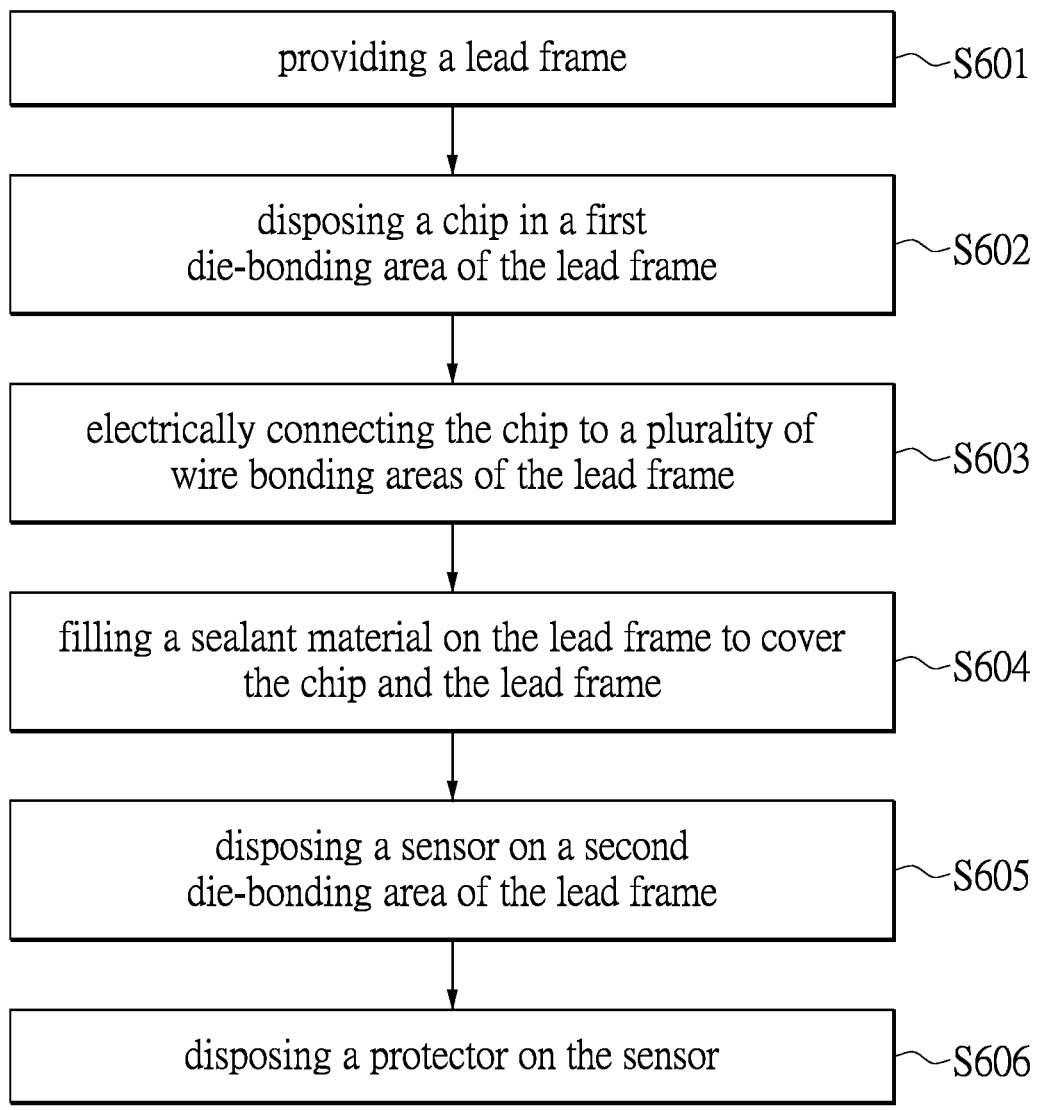
FIG. 6 is a manufacturing method flowchart of the sensing device according to one embodiment of the present disclosure.

FIG. 6 is a manufacturing method flowchart of the sensing device according to the embodiment of the present disclosure. Referring to FIG. 6, which is to be read in conjunction with FIG. 1 to FIG. 5 and reference numerals therein, a lead frame 11 is provided in step S601. The lead frame 11 can be a metal lead frame, and can be integrally formed by a die casting method. The lead frame 11 includes a first surface 111 and a second surface 112 opposite to the first surface 111. The lead frame 11 includes a first die-bonding area 113, a plurality of wire bonding areas 114, a second die-bonding area 115, and a plurality of pad areas 117. In step S602, a chip 12 is disposed in the first die-bonding area 113 of the lead frame 11 and is electrically connected to the wire bonding areas 114 of the lead frame 11 through conductive wires 16 by wire bonding. Furthermore, the chip 12 can be directly disposed in the first die-bonding area 113 of the lead frame 11, or a heat dissipation film 17 can be disposed on the first die-bonding area 113 first, and then the chip 12 is disposed on the heat dissipation film 17, and it is not limited herein. The chip 12 has a plurality of contact points 121, and two ends of each the conductive wires 16 can be respectively connected to the contact points 121 of the chip 12 and the wire bonding areas 114, so as to achieve the purpose of the chip 12 and the lead frame 11 being electrically connected.

In step S604, the lead frame 11 is filled with a sealant material. Specifically speaking, the sealant material can be filled on the first surface 111 or the second surface 112 of the lead frame 11 all at once, and the sealant material will automatically flow to the second surface 112 or the first surface 111, and form the first part 131 and the second part 132 of the insulated housing 13 of the first embodiment and the second embodiment. Alternatively, the sealant material can be filled on the lead frame 11 twice, with the second part 132 of the insulated housing 13 being formed first, and the first part 131 of the insulated housing 13 being formed second. For example, after a step of the lead frame 11 being installed with the chip 12 and wire bonding of the conductive wires 16, the lead frame 11 is put into a mold with a height difference (not shown), and the mold is then filled with the sealant material for forming the insulated housing 13 to the first surface 111 or the second surface 112. The first part 131 of the insulated housing 13 is located between the pins 116 and cover the chip 12 and the conductive wires 16, and the second part 132 of the insulated housing 13 is disposed around the pins 116, extends along a direction, and surrounds a periphery of the second surface 112 of the lead frame 11, thereby forming an accommodating groove 18 on the second surface 112 or forming a flat plane with the surfaces of the pad areas 117. In the embodiment of the present disclosure, the color of the sealant material is preferably black, since black sealant materials can block most ambient light from being transmitted to the sensor 14 and prevent the sensing accuracy of the sensor 14 from decreasing due to the ambient light.

In step S605, the sensor 14 is disposed on the second die-bonding area 115 of the second surface 112 of the lead frame 11. Specifically speaking, the sensor 14 is disposed on the lead frame 11, and is located in the accommodating groove 18 formed by the insulated housing 13 of the first embodiment or in the accommodating groove 18 formed by the protector 15 of the second embodiment. The sensor 14 will be in contact with the second die-bonding area 115 of the lead frame 11, and the heat generated by the sensor 14 during operation can be transferred to the lead frame 11 to achieve a heat dissipation effect of the sensor 14. In step S606, the protector 15 is disposed on the sensor 14, and the protector 15 is located on the insulated housing 13. In detail, the protector 15 is disposed on the insulated housing 13, and the protector 15 is supported by the second part 132 around the pins 116. In this way, the sensor 14 is protected, and ambient light is prevented from radiating thereon, thereby completing the step of disposing the protector 15. The protector 15 is preferably made of glass, so that not only can the sensor 14 be prevented from directly contacting the external environment, but light other than infrared light can be blocked from transmitting to the sensor 14. In the present disclosure, the protector 15 is preferably made of an infrared light-transmitting glass material or special materials that can be applied on the protector 15 to achieve the purpose of blocking ambient light and allowing only infrared light to penetrate through.

After disposing the protector 15, the steps of manufacturing the sensing device of the present disclosure are completed. In fact, an additional step can be further included in the present disclosure, which is to cut the plurality of finished sensing devices 10 within the mold into individual sensing devices 10. Or, in different embodiments of the present disclosure, a testing step can be further included to test the sensing effect of each of the sensing devices 10, thereby completing the steps of manufacturing the sensing device 10 of the present disclosure.

In conclusion, one of the beneficial effects of the present disclosure is that, the volume of the sensing device of the present disclosure can be reduced by virtue of "disposing the chip and the sensor on the first surface and the second surface that are opposite to each other, respectively."

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensing device, comprising:
    a lead frame including a first surface, a second surface opposite to the first surface, a first die-bonding area and a plurality of wire bonding areas of the lead frame disposed on the first surface, and a second die-bonding area disposed on the second surface;
    a chip disposed in the first die-bonding area of the lead frame and electrically connected to the wire bonding areas of the lead frame;
    an insulated housing covering the chip and a portion of the lead frame;
    a sensor disposed on the second die-bonding area of the lead frame; and
    a protector;
    wherein the protector is disposed under the sensor to completely cover the sensor, and the sensor is exposed in an accommodating space which is formed by the protector and the insulated housing;
    wherein the sensor is in direct contact with a plurality of pad areas surrounding the second die-bonding area.

2. The sensing device according to claim 1, wherein a plurality of pins are bent outward and extend along a direction from the plurality of wire bonding areas of the lead frame, and the pins surround the first die-bonding area to protect the chip.

3. The sensing device according to claim 2, wherein a step is formed between a surface of the wire bonding areas and a contact surface of the pins according to chip type.

4. The sensing device according to claim 3, wherein the contact surface of the pins are flush with a top surface of the insulated housing.

5. The sensing device according to claim 2, wherein a thickness of a stepped structure in each of the pins exposed on a side surface of the insulated housing is less than a thickness of the wire bonding areas.

6. The sensing device according to claim 1, wherein the protector is a U-shaped glass or a glass plate, the protector and the insulated housing jointly define the accommodating space, and the sensor is located in the accommodating space.

7. The sensing device according to claim 1, wherein the insulated housing includes a first part and a second part, the first part covers the chip, the first die-bonding area and the plurality of wire bonding areas which are located on the first surface, and the second part surrounds a periphery of the second surface and is connected to the protector to define the accommodating space for accommodating the sensor.

8. The sensing device according to claim 7, wherein at least one notch is formed on a surface of the second part of the insulated housing.

9. The sensing device according to claim 1, further comprising a heat dissipation film that is disposed between the chip and the first die-bonding area of the lead frame.

10. The sensing device according to claim 1, wherein a gap is formed between the sensor and the protector, and the insulated housing is made of a black material being silicone or epoxy resin.

11. A method for packaging a sensing device, comprising:
    providing a lead frame;
    disposing a chip in a first die-bonding area of the lead frame;
    electrically connecting the chip to a plurality of wire bonding areas of the lead frame;
    filling a sealant material on the lead frame to form an insulated housing that covers the chip and a portion of the lead frame;
    disposing a sensor on a second die-bonding area of the lead frame, the first die-bonding area and the second die-bonding area being located on different planes of the lead frame, respectively; and
    disposing a protector;
    wherein the protector is disposed under the sensor to completely cover the sensor, and the sensor is exposed in an accommodating space which is formed by the protector and the insulated housing;
    wherein the sensor is in direct contact with a plurality of pad areas surrounding the second die-bonding area.

12. The method according to claim 11, wherein in the step of filling the sealant, the plurality of wire bonding areas of the lead frame further includes a plurality of pins exposed outside of the insulated housing.

13. The method according to claim 11, wherein in the step of disposing the protector, the protector is a U-shaped glass or a glass plate, the protector and the insulated housing jointly define the accommodating space, and the sensor is located in the accommodating space.

14. The method according to claim 11, further comprising a step of disposing a heat dissipation film on the first die-bonding area of the lead frame before the step of disposing a chip.

15. The method according to claim 11, wherein, in the step of forming the insulated housing, the insulated housing includes a first part and a second part, the first part covers the chip, the first die-bonding area and the plurality of wire bonding areas which are located on the first surface, and the second part surrounds a periphery of the second surface and is connected to the protector to define the accommodating space for accommodating the sensor.

* * * * *